United States Patent [19]

Theimer

[11] Patent Number: 4,674,868

[45] Date of Patent: Jun. 23, 1987

[54] PRINTING FRAME

[76] Inventor: Siegfried Theimer, Rohler Strasse 10, 6484 Birstein 6, Fed. Rep. of Germany

[21] Appl. No.: 848,491

[22] Filed: Apr. 7, 1986

[30] Foreign Application Priority Data

Apr. 6, 1985 [DE] Fed. Rep. of Germany .... 3512677

[51] Int. Cl.$^4$ ............................................. G03B 27/04
[52] U.S. Cl. ................................................. 355/122
[58] Field of Search ........................ 355/118, 122–126, 355/133

[56] References Cited

U.S. PATENT DOCUMENTS 2,399,975  5/1946  Ball ..................................... 355/122
4,450,536  5/1984  Schroeder ...................... 355/126 X
4,533,240  8/1985  Jasperson ............................ 355/125

Primary Examiner—Richard A. Wintercorn
Attorney, Agent, or Firm—Schwartz, Jeffery, Schwaab, Mack, Blumenthal & Evans

[57] ABSTRACT

A printing frame for the preparation of copies from a master. The printing frame has a mat which is secured to a base plate such that the mat is free to shift in all directions. Photographic material and the master are placed on the mat, and a transparent plate is placed over the material and the master. Vacuum is applied to the frame to adhere the mat, the material and the master to the transparent plate. Because the mat can move freely, hollow spots or non-adhering spaces are eliminated.

6 Claims, 4 Drawing Figures

PRINTING FRAME

BACKGROUND OF THE INVENTION

The present invention relates to a printing frame for the exposure of photographic material as is known from German Patent Specification No. 2,928,320. Such printing frames serve in the preparation of copies from a master, in particular the exposure of films, offset printing plates or photopolymer printing plates which are to be termed collectively as photographic material, the master and the photographic material together being the copying partners.

In the exposure of such photographic materials through a master, the quality of the copying result depends decisively on a flush, completely space-free contact of the photographic material on the master. To ensure this, in order to press the photographic material reliably against the master over its entire area, in the case of downward exposure the glass plate is swung down onto a pliable mat with the copying partners lying on it, the plate coming into sealed contact with a sealing bead bounding the mat. Through an opening in the mat, which can be connected to a vacuum source, a vacuum is introduced into the space between the glass plate and mat, so that the mat and the copying partners (master and photographic material) resting on it are sucked against the glass plate or pressed by the greater atmospheric pressure acting on the underside of the mat against the glass plate.

The mat is usually a fabric-coated mat which, although it has a low coefficient of friction, is rigid in its plane and not compressible. In the case of such mats, the problem arises of avoiding hollow copies, i.e., copies with unsharp regions which occur due to the presence of spaces which remain between the master and the photographic material, in spite of efforts to achieve a full-area intimate contact. In these space regions, the mat has been kept a distance from the glass plate or the copying partners. One reason for this spacing is that the borders of the mat are usually firmly fixed on the base plate so that the mat is stressed relative to the glass plate. On account of this stress, the borders of the mat cannot creep outwards or to the side as would be necessary if any rising of the mat were to be compensated under vacuum effect. It must also be mentioned that the mats have corresponding tolerances.

In the case of prior art designs, a remedy is sought by having a fold incorporated all around in the vicinity of the borders of the mat parallel to the sealing beads, which fold facilitates the relative shifts occurring between mat and glass plate. The same effect is achieved if a jutting sealing web is provided all around along the borders of the mat, the web deforming in an S-shape whenever the border of the mat creeps. In this way, it is intended to ensure the possiblity of compensating for waves and bumps by permitting the borders to creep still during the laying flat.

The results achieved with the known prior art designs are not, however, always satisfactory because the fold running along the border of the mat quickly draws together when the vacuum is introduced and loses its effect so that the border fixing of the mat again hinders the compensation of risings and thus complete laying flat after all.

DISCLOSURE OF INVENTION

It is accordingly an object of the invention to provide a printing frame for the exposure of photographic material in which a master and the photographic material are contacted in a flush, space-free manner.

It is another object of the invention to provide a printing frame, as above, in which a mat is movable with respect to a base plate.

It is yet another object of the invention to provide a printing frame, as above, which eliminates the need for folds to effect a flush, space-free contact.

These objects are achieved by a printing frame for the exposure of photographic material from a master, comprising a transparent plate, a base plate, a mat having a border portion, means for securing the border portion of the mat to the base plate in a manner to permit the mat to shift in all directions, means for releasably and sealingly positioning the transparent plate onto the mat on a side opposite the base plate, and means for releasably adhering the mat to the transparent plate, wherein photographic material and a master placed on the mat prior to positioning the transparent plate are contacted by the mat and the transparent plate in a flush and space-free manner through application of the adhering means.

BRIEF DESCRIPTION OF THE DRAWINGS

The invention is explained further below by the description of an exemplary embodiment with reference to the accompanying drawings, in which.

DETAILED DESCRIPTION OF THE PREFERRED EMBODIMENTS

The mat of the present invention has an all-round free expansion capability which permits the mat, after repeated use, to itself find an optimum position relative to the glass plate, i.e., the mat is self-adjusting. The vacuum applied to the mat thus does not have to additionally compensate for the stresses, which in practice is in many cases not even possible, which would result in hollow copies. The standard of the copying quality is also not jeopardized if a composition is used as the master, in other words, a base sheet with individual film pieces. Such a composition with upstanding thickness at the borders of the film masters is problematical in the case of mats with rigid border fixing because the alternating thicknesses of the composed master result in a flush lying mat having different distances of the borders from one another. The proposed design makes this quite possible.

The exemplary embodiment concerns the case of downward exposure in which the copying partners are laid on a mat, the glass plate is swung down onto this, and the exposure is performed by a light source arranged above. In the same way, the present invention can, however, be applied to the case of upward exposure in which the copying partners are laid onto the glass plate, the mat is swung down onto this and the exposure is performed from below.

Figure 1:
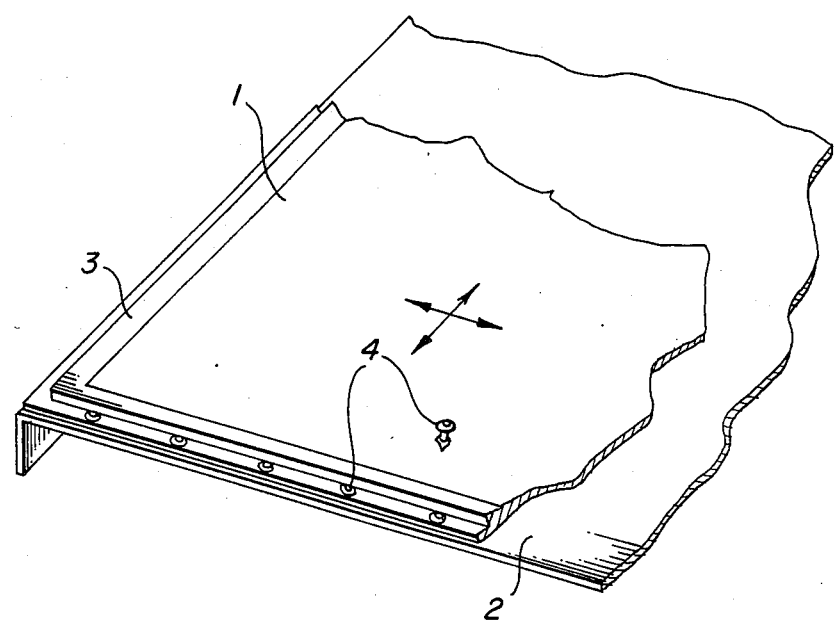
FIG. 1 is a partial cross-section showing the left front corner of a mat on its base plate.

FIG. 1 shows a part of a mat 1 which rests on a base plate 2. The mat 1 has, in the vicinity of its borders and running parallel thereto, a sealing bead 3 which effects border sealing when the glass plate is in its lowered position.

Figure 2:
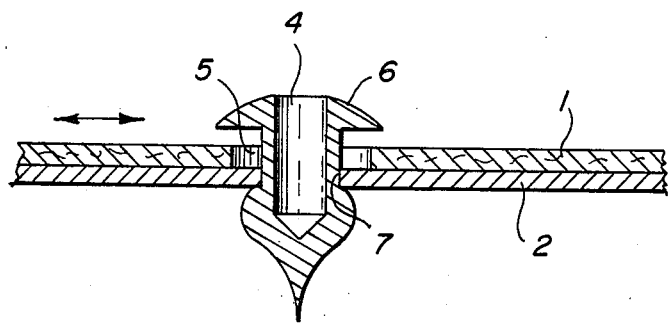
FIG. 2 is a cross-section through a border fastening point.
Figure 4:
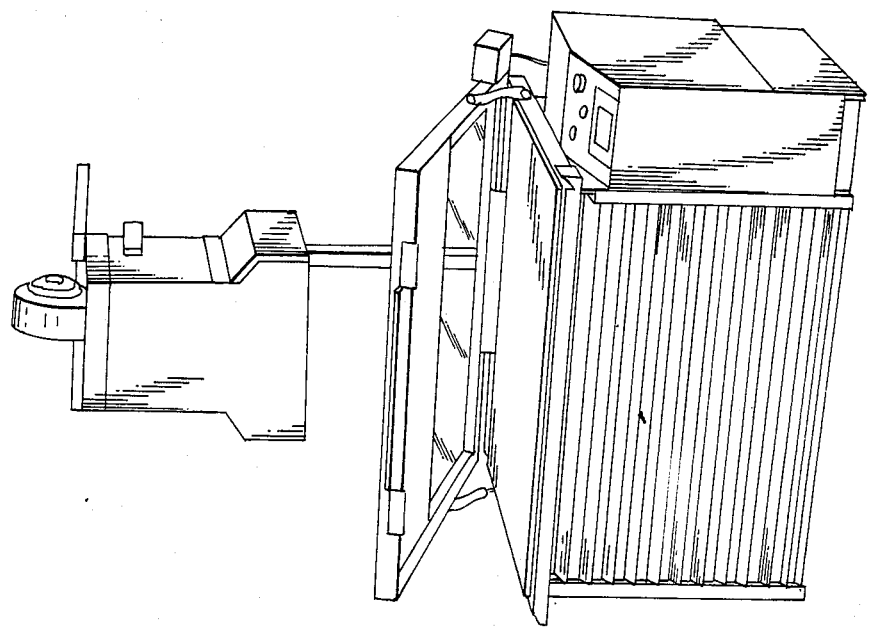
FIG. 4 is a view of the exposure device of the type according to FIG. 3 showing the glass plate in an open position.
Figure 3:
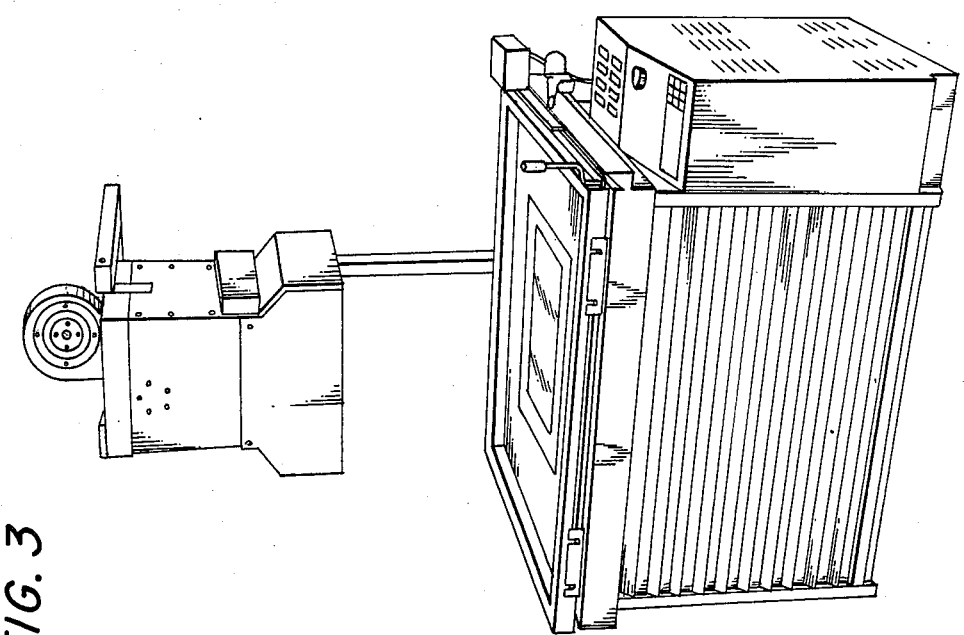
FIG. 3 is a frontal perspective view of a photographic exposure device of a type in which the printing frame of the invention is employed.

The borders of the mat 1 are held floating on the base plate 2 by means of anchor knobs 4. For this purpose, the anchor knobs are inserted rigidly into corresponding bores 7 in the base plate 2 and protrude through round holes 5 in the borders of the mat, the diameter of which substantially exceeds that of the anchor knob shank. A bottom portion of the anchor knob can extend from the base plate as shown in FIG. 2. Thus, a space remains all around which permits a corresponding relative movement of the borders of the mat.

The head 6 of each anchor knob 4 has a diameter which again exceeds the diameter of the round hole 5 so that the mat remains reliably held.

The crossing arrows in FIG. 1 are intended to indicate that each point of the mat 1 can shift relatively freely in all directions, so that the compensation of waves and buckles of the mat when it is lying flush against the glass plate is not hindered.

What is claimed is:

1. A printing frame for use in a device having a transparent plate employed in the exposure of photographic material from a master, comprising:
   a base plate;
   a mat having a border portion;
   means for securing said border of said mat to said base plate in a manner to permit said mat to shift in all directions;
   means for releasably and sealingly positioning the transparent plate onto said mat on a side opposite said base plate; and
   wherein photographic material and a master placed on said mat prior to positioning said transparent plate are contacted by said mat and said transparent plate in a flush and space-free manner.

2. A printing frame as claimed in claim 1, wherein said border portion of said mat is in floating connection with said base plate.

3. A printing frame as claimed in claim 1, wherein said means for securing said border portion includes:
   a plurality of holes in said border portion;
   a plurality of anchor knobs having shank portions and head portions, the shank portion of each anchor knob being inserted in a separate hole in said border portion; and
   means for attaching said anchor knobs to said base plate;
   wherein the diameters of said holes are larger than the diameters of said shank portions and smaller than the diameters of said head portions, and wherein said shank portions extend beyond said border section in a direction towards said transparent plate.

4. A printing frame as claimed in claim 3, wherein said means for attaching said anchor knobs to said base plate includes a plurality of bores in said base plate, each bore registerable with a separate hole in said border portion, and wherein a bottom portion of each anchor knob extends through a separate bore of said base plate.

5. A printing frame as claimed in claim 1, wherein said adhering means includes the application of vacuum between said mat and said transparent plate.

6. A printing frame as claimed in claim 1, including means associated with said printing frame for adhering said mat, said master and said photographic material to said transparent plate.

* * * * *